(12) United States Patent
Hirata et al.

(10) Patent No.: US 7,269,019 B2
(45) Date of Patent: Sep. 11, 2007

(54) MOUNTING SUBSTRATE AND DRIVING DEVICE USING SAME

(75) Inventors: Akihiko Hirata, Kasugai (JP);
Tokihiko Sugiura, Utsunomiya (JP);
Yasuhide Tanaka, Owariasghi (JP)

(73) Assignee: OMRON Corporation, Kyoto (JP)

( * ) Notice: Subject to any disclaimer, the term of this patent is extended or adjusted under 35 U.S.C. 154(b) by 250 days.

(21) Appl. No.: 11/165,742

(22) Filed: Jun. 25, 2005

(65) Prior Publication Data
US 2006/0007643 A1    Jan. 12, 2006

(30) Foreign Application Priority Data
Jul. 6, 2004    (JP)    ............................. 2004-199264

(51) Int. Cl.
*H05K 7/20*    (2006.01)
(52) U.S. Cl. ........................ 361/719; 361/707; 361/721
(58) Field of Classification Search ...................... None
See application file for complete search history.

(56) References Cited

U.S. PATENT DOCUMENTS

| | | | | |
|---|---|---|---|---|
| 5,390,078 A | * | 2/1995 | Taylor | ........................ 361/721 |
| 5,438,479 A | * | 8/1995 | Heilbronner | ................. 361/707 |
| 5,764,487 A | * | 6/1998 | Natsume | ...................... 361/775 |
| 6,008,982 A | * | 12/1999 | Smith | ........................... 361/624 |
| 6,071,016 A | * | 6/2000 | Ichino et al. | .................. 385/92 |
| 6,101,094 A | * | 8/2000 | Kermaani et al. | ........... 361/720 |
| 6,154,369 A | * | 11/2000 | Martinez et al. | ............. 361/719 |
| 6,272,015 B1 | * | 8/2001 | Mangtani | ..................... 361/707 |
| 6,478,585 B2 | * | 11/2002 | Yuasa et al. | ................. 439/76.2 |
| 6,603,283 B2 | * | 8/2003 | Yuasa et al. | ................. 320/104 |
| 6,724,627 B2 | * | 4/2004 | Onizuka et al. | ............. 361/704 |
| 6,870,096 B2 | * | 3/2005 | Suzuki et al. | .................. 174/50 |
| 6,972,959 B2 | * | 12/2005 | Asai et al. | .................... 361/719 |
| 6,995,461 B2 | * | 2/2006 | Soyano et al. | ............... 257/678 |

* cited by examiner

*Primary Examiner*—Boris Chervinsky
(74) *Attorney, Agent, or Firm*—Beyer Weaver LLP

(57) ABSTRACT

A driving device for a motor has a mounting substrate mounted to a base substrate. Highly heat-generating components such as a switching element for PWM control are mounted to the mounting substrate and only less heat-generating circuit components are mounted to the base substrate. The mounting substrate has a base plate part made of a metallic plate material surround by a molded insulating material but includes a heat dissipating part where the insulating material is removed and the internal metallic plate material is exposed.

14 Claims, 9 Drawing Sheets

MOUNTING SUBSTRATE AND DRIVING DEVICE USING SAME

Priority is claimed on Japanese Patent Application 2004-199264 filed Jul. 6, 2004.

BACKGROUND OF THE INVENTION

This invention relates to a mounting substrate suitable, for example, for a power window system for a vehicle as well as to a driving device using such a substrate.

Electronic controls are the main method of control for the likes of a power window of a vehicle, say, for automatically reversing the direction of motion of a window when an inserted object is detected. Thus, a common driving method is to make use of a relay, as disclosed in Japanese Patent Publication Tokkai 10-169311, in a driving device that supplies power appropriately to a motor serving as the power source for such an opening and closing mechanism and is provided with a control circuit including a control means such as a microcomputer. Explained more in detail, such a driving device is comprised of two relays for supplying power to the motor so as to rotate is in a positive direction (say, for a upward motion of a window for opening it) and in a negative direction (say, for a downward motion of the window for closing it), a switch for causing the motor to rotate in the positive or negative direction in response to an operation at an operating section (say, by means of an operating knob) and a control circuit (including a transistor for driving these relays and a one-chip microcomputer for controlling this transistor) for controlling the relays according to an input from this switch.

For the control of a power window, devices capable of a high-level control such as varying the speed of the object of control (such as a glass pane) are beginning to appear in response to the market needs. Such a control device may include a switching element such as a FET provided to a power supply line for the motor such that the switching element can be controlled by pulse width modulation (PWM) at the time of operation of the motor at a specified duty ratio corresponding to the target of control.

Japanese Patent Publication Tokkai 10-201050 discloses an electrical connector case having a separate substrate referred to as a box with an inverted U-shape having an inner-molded bus bar (a metallic circuit conductor) mounted on the upper surface of an insulator substrate. The bus bar of this box forms a major part of the wiring pattern of the power source system, and the fuses and relays of the power source system are attached to the bus bar of the box. Japanese Patent Publication Tokkai 8-11732 discloses a power steering circuit device having a wiring pattern for passing a large current formed by a metallic plate material affixed by molding. A switching element is mounted to a heat-radiating plate apart from a printed circuit board on which a microcomputer is mounted, and this heat-radiating plate and the printed circuit board are superposed with a specified interval in between.

Problems occur with such driving devices with a control capability as described above if the circuit components for the PWM control such as the switching element are simply mounted to the same substrate with the other basic circuit components such as the relays and the switches as described above. In other words, as the device becomes larger in the direction parallel to the substrate, it becomes difficult to fit within a limited space allowable in a vehicle. In the case of a driving device not adapted to carry out the PWM control, furthermore, the structure of the substrate as a whole becomes different and hence the productivity is adversely affected.

With a structure having all of the aforementioned circuit components mounted to an inexpensive printed circuit board of a general kind, heat generated by the circuit components for the PWM control such as the switching element described above cannot be dissipated effectively to the exterior and it is not possible to prevent the overheating of the switching element or other circuits around it. If all of such circuit components are mounted to a substrate formed by resin-molding a metallic plate material (substantially thicker than the conductive layer of the printed substrate) which becomes the circuit conductor, the problem of overheating can be somewhat improved from the case of a printed circuit board because the resistance of the circuit conductor (and especially the current-carrying line for the motor) can be reduced but the device as a whole becomes larger and both the cost and weight will increase.

In view of the above, it may be considered to mount the circuit components for the PWM control to a separate substrate (mounting substrate) and to mount this separate substrate to a main substrate (or the base substrate) to which the basic circuit components are mounted. There are problems, however, to actually produce such a structure. For example, although the heat generated by the circuit components for the PWM control such as switching element must be eliminated efficiently, a simple structure as disclosed in aforementioned Japanese Patent Publication Tokkai 10-201050 is not sufficient. If a heat-radiating plate is additionally provided as disclosed in aforementioned Japanese Patent Publication Tokkai 8-11732, on the other hand, the total number of components becomes large and this affects the production cost adversely.

If the structure is such that another substrate is mounted onto a main substrate, another problem arises regarding the connection between the switch on the main substrate and the operation section by avoiding interferences among the components. In the example of aforementioned Japanese Patent Publication Tokkai 10-201050, it would be difficult to avoid interferences between the connecting part for the switch and the operating knob and another substrate unless the main substrate is made larger in the lateral direction.

SUMMARY OF THE INVENTION

It is therefore an object of this invention to provide a mounting substrate capable of effectively dissipating heat without increasing the number of constituent components, as well as a driving device making use of such a mounting substrate.

A mounting substrate according to this invention is basically a substrate made of a metallic plate material covered with an insulating material formed by a molding process, adapted to have highly heat-generating circuit components mounted thereto and to be mounted to another plate which is herein referred to as a "base substrate" and has mounted thereto a basic circuit for controlling these circuit components. The mounting substrate itself is characterized as comprising a base plate part that is planar and rectangular, having a circuit pattern made of the aforementioned metallic plate material inside the molded insulating material, legs extending approximately perpendicularly from both end sides of this base plate part and having connector conductors made of this same metallic plate material inside the molded insulating material, the connector conductors each having a tip part exposed from the molded insulating material to serve as a contact terminal, and a heat dissipating plate also made of the metallic plate material at one end side of the base plate part, having a heat dissipating part that is extending from the base plate part and is externally exposed.

In the above and throughout herein, the "highly heat-generating circuit components" are those circuit components that normally generate significantly more heat (having a significantly higher power consumption rate) than any of the components mounted to the base substrate and may include, for example, semiconductor switching elements such as FETs and flywheel diodes to be used for the PWM control of a motor. The "connector conductors" are components for the purpose of electrically connecting a specified circuit pattern on the base plate part of the mounting substrate with a corresponding circuit pattern on the base substrate. The contact terminal may be a terminal for insert mounting or for surface mounting.

Because the mounting substrate according to this invention is provided with a metallic heat dissipating plate having a heat dissipating part that is not covered with any insulating material but is exposed externally, heat generated by highly heat-generating components can be more efficiently dissipated. Moreover, since this heat dissipating plate is provided by using the same material as and as a part of the same circuit pattern of the base plate part, it can be produced easily and hence inexpensively, say, by punching out of a hoop material.

According to a preferred embodiment of the invention, at least one of the legs and the heat dissipating plate are disposed next to each other on the same end side of the base plate part. This means that, when they are formed together from the material for the base plate part, the portion that would otherwise be cut off and discarded is bent and made into the heat dissipating part of the mounting substrate. In other words, the portion that would be wasted is reduced and hence the production cost is reduced according to this preferred embodiment.

The heat dissipating plate according to the preferred embodiment of the invention is further provided with a heat-receiving part disposed inside the base plate part and the highly heat-generating circuit components are mounted proximally to the heat dissipating part and to the heat-receiving part either directly or through a thinned portion of the insulating material such that the heat can be dissipated efficiently.

In the case where the aforementioned heat-receiving part is provided, it is preferable that these highly heat-generating circuit be mounted to the inner surface of the base plate part facing the base substrate and that a heat dissipating opening be formed through the insulating material on the outer surface of the base plate part such that the heat dissipating plate is exposed to the exterior. It is further preferable in this case to provide a solder contained in this heat dissipating opening.

The present invention also relates to a driving device which may be characterized as being a motor driving device comprising relays for operating a motor by supplying power from a power source according to operation condition of an operating part, a switch adapted to change switch condition thereof according to the operation condition of the operating part, a control circuit for controlling the relays according to the switch condition of the switch, the basic circuit that includes the relays, the switch and the control circuit, the base substrate to which the basic circuit is mounted, the mounting substrate as described above, mounted to the base substrate, and control circuit components mounted to this mounting substrate, the control circuit components including a switching element being connected to a power line of the motor and serving to control the motor when the motor is operating.

In the above, the operating part means the part where the operator actually operates, say, with the finger for inputting a command for operating the motor. This may be in the form of a knob to be pulled up or down and in the form of a seesaw. It may include junctions such that the operator may feel a "click" when reaching a specified command position. Such a feeling is advantageous in providing stability in the operation of the operating part. The "motor" means an actuating agent for a mobile member and need not necessarily be a motor of a rotary kind. The mobile member to be actuated include a window, a sunroof, a seat and a door of a vehicle or a building. The vehicle includes an automobile, an airplane and an elevator. The driving device may be for a power window, a power seat or a sliding door of a vehicle or a building. The control of a motor may include the PWM control. It goes without saying that the invention is not limited to such examples.

According to this invention, a driving device can be made compact because the mounting substrate of this invention can be superposed on top of the base substrate and circuit components can be arranged three-dimensionally.

A driving device according to a preferred embodiment may be characterized wherein the basic circuit has components that are mounted to inner surface of the base substrate facing the mounting substrate, wherein the operating part is disposed on an outer surface of the base substrate not facing the mounting substrate, and wherein an operating member movable integrally or in coordination with the operating part is connected to the switch through an opening formed through the base substrate such that the switch condition of the switch is varied. In the above, the connection need not be a mechanical connection but may also be an optical or electrical connection. The connection may be of a type, say, as disclosed in Japanese Patent Publication Tokkai 2001-118465, making use of a switch adapted to detect the movement of the operating part by a non-contacting means such as a Hall element or an optical sensor. In such an application, to place the operating part at a specified position with respect to such a sensor corresponds to the aforementioned connection.

DETAILED DESCRIPTION OF THE INVENTION

Figure 1:
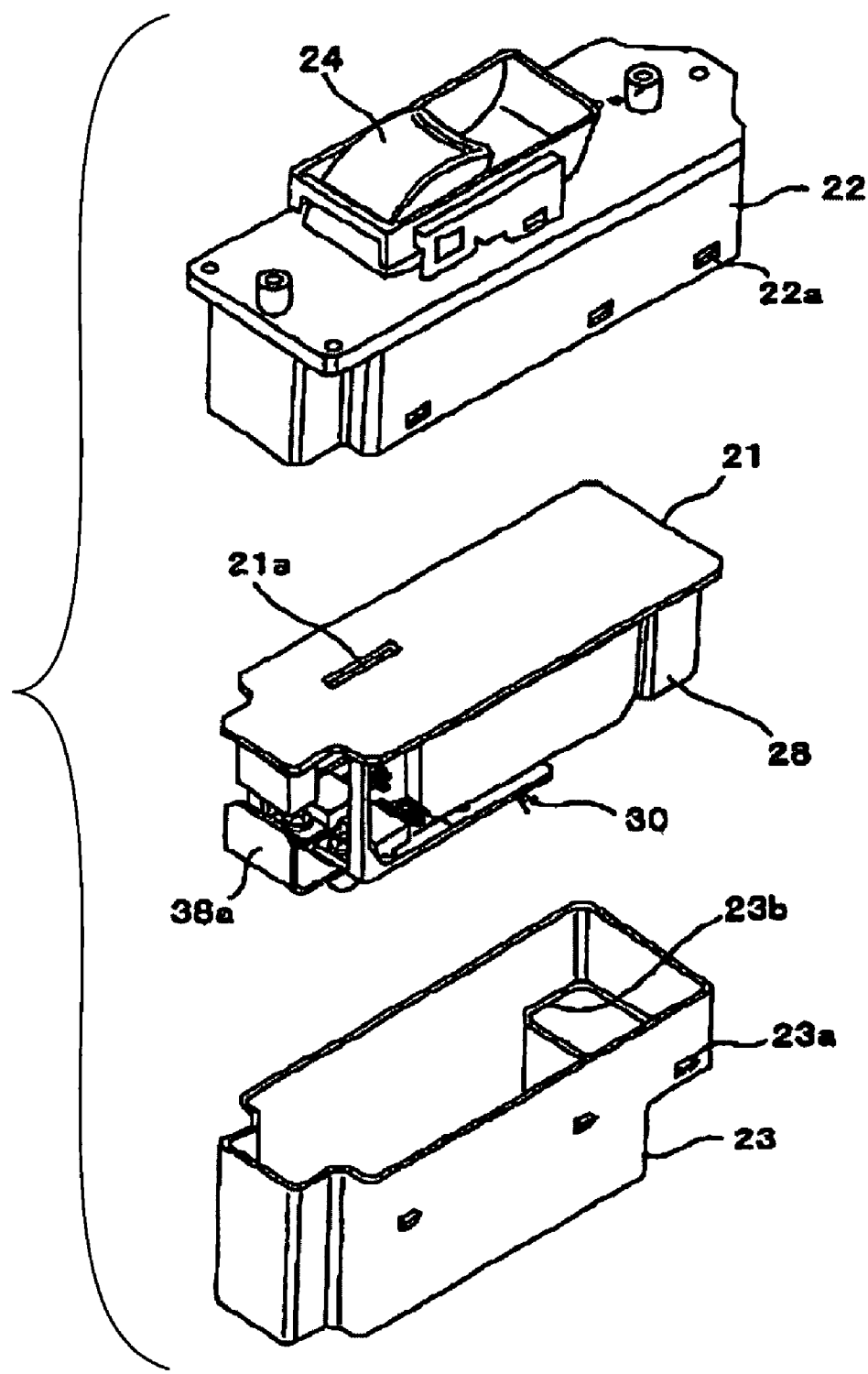
FIG. 1 is an exploded diagonal view of a driving device embodying this invention, showing its front surface.
Figure 2:
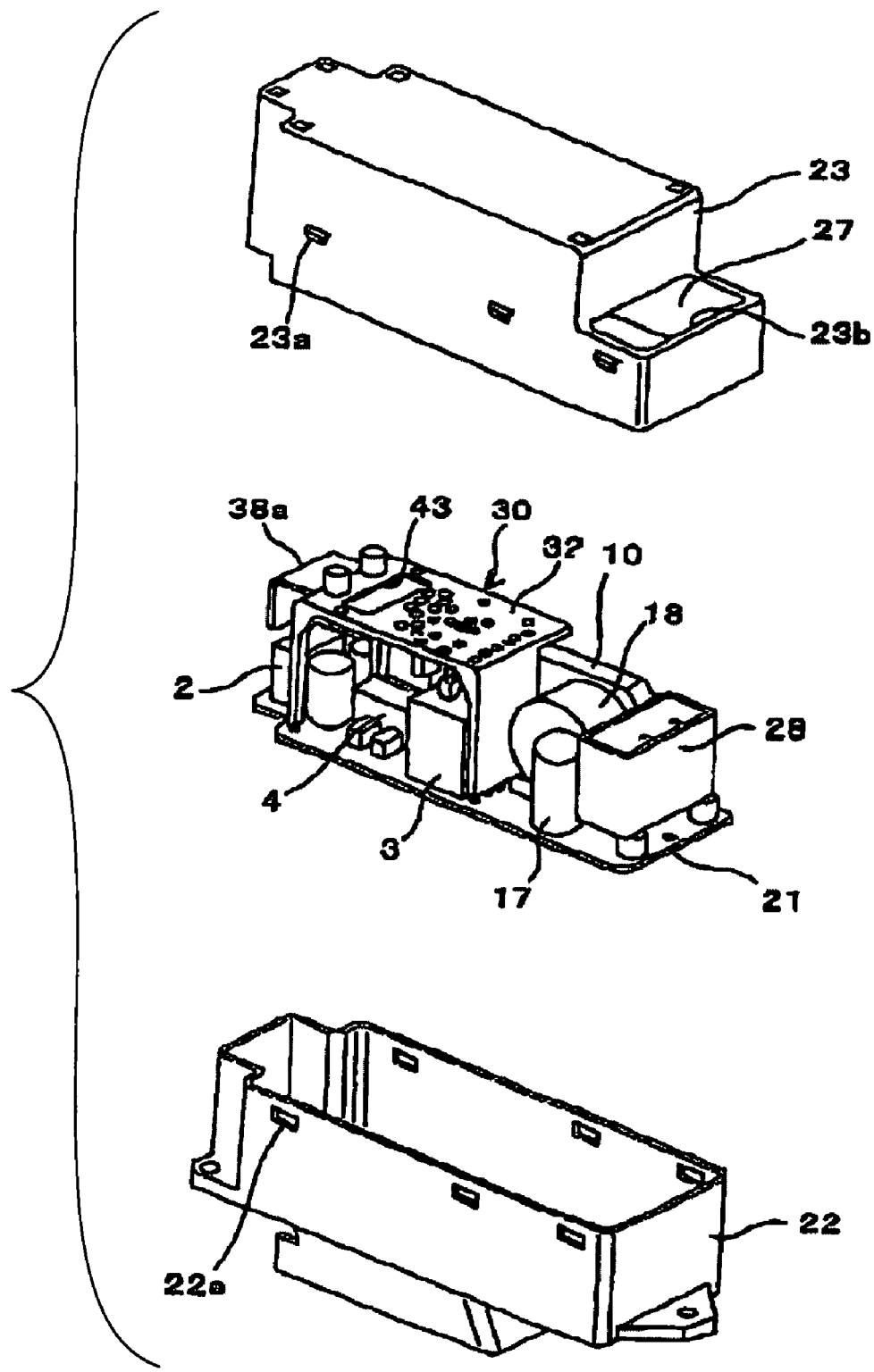
FIG. 2 is its exploded diagonal view, showing its back surface.
Figure 3A:
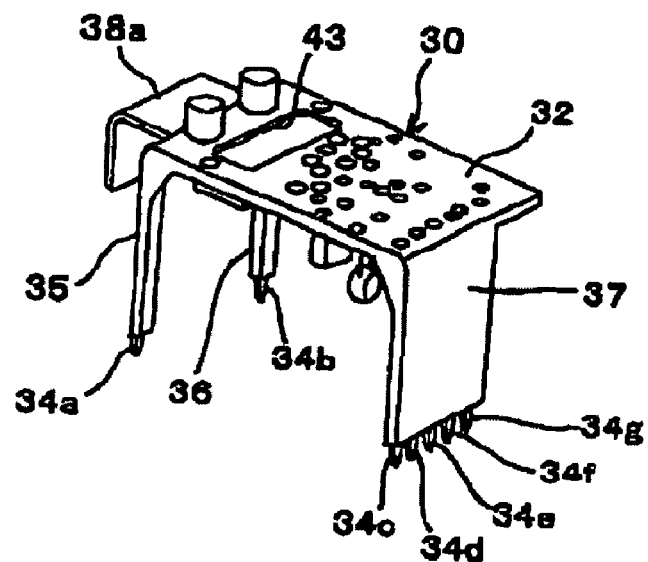
FIG. 3A is a diagonal view of the mounting substrate and FIG. 3B is a diagonal view of the base substrate.
Figure 3B:
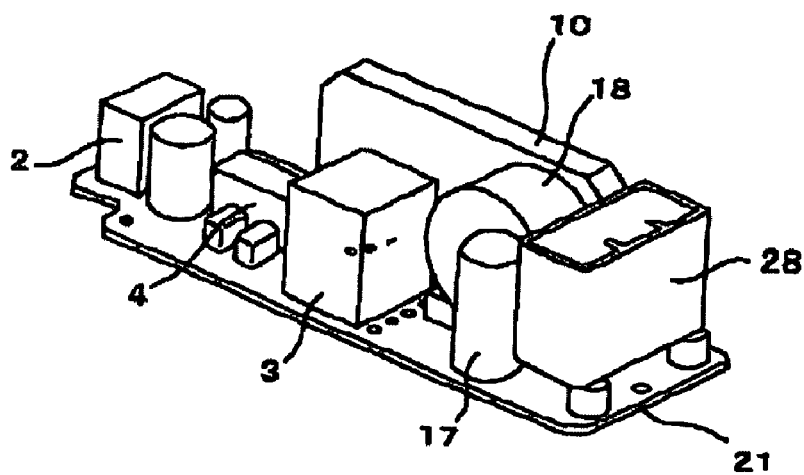
Figure 4:
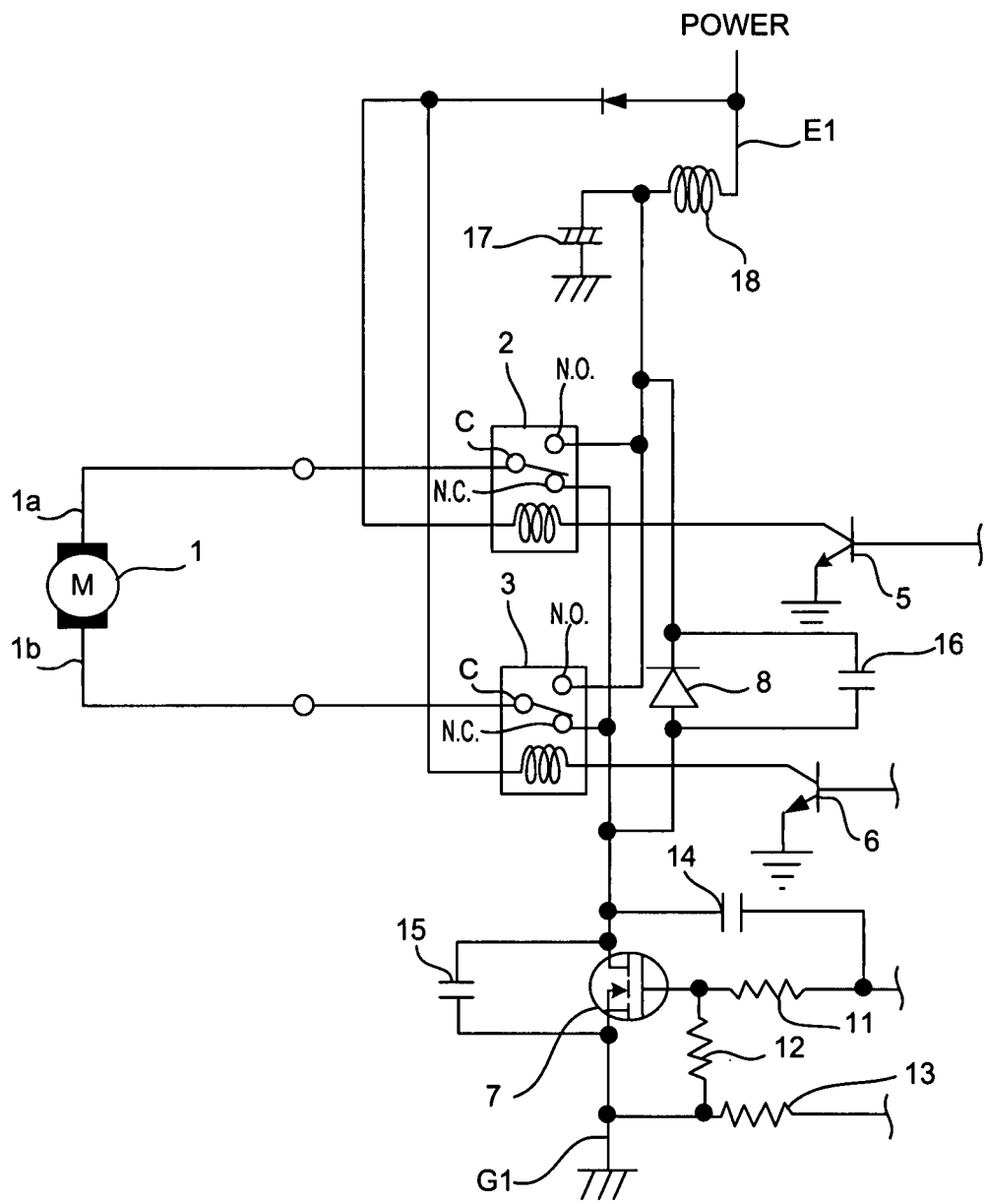
FIG. 4 is a circuit diagram of main circuits of the driving device.
Figure 7:
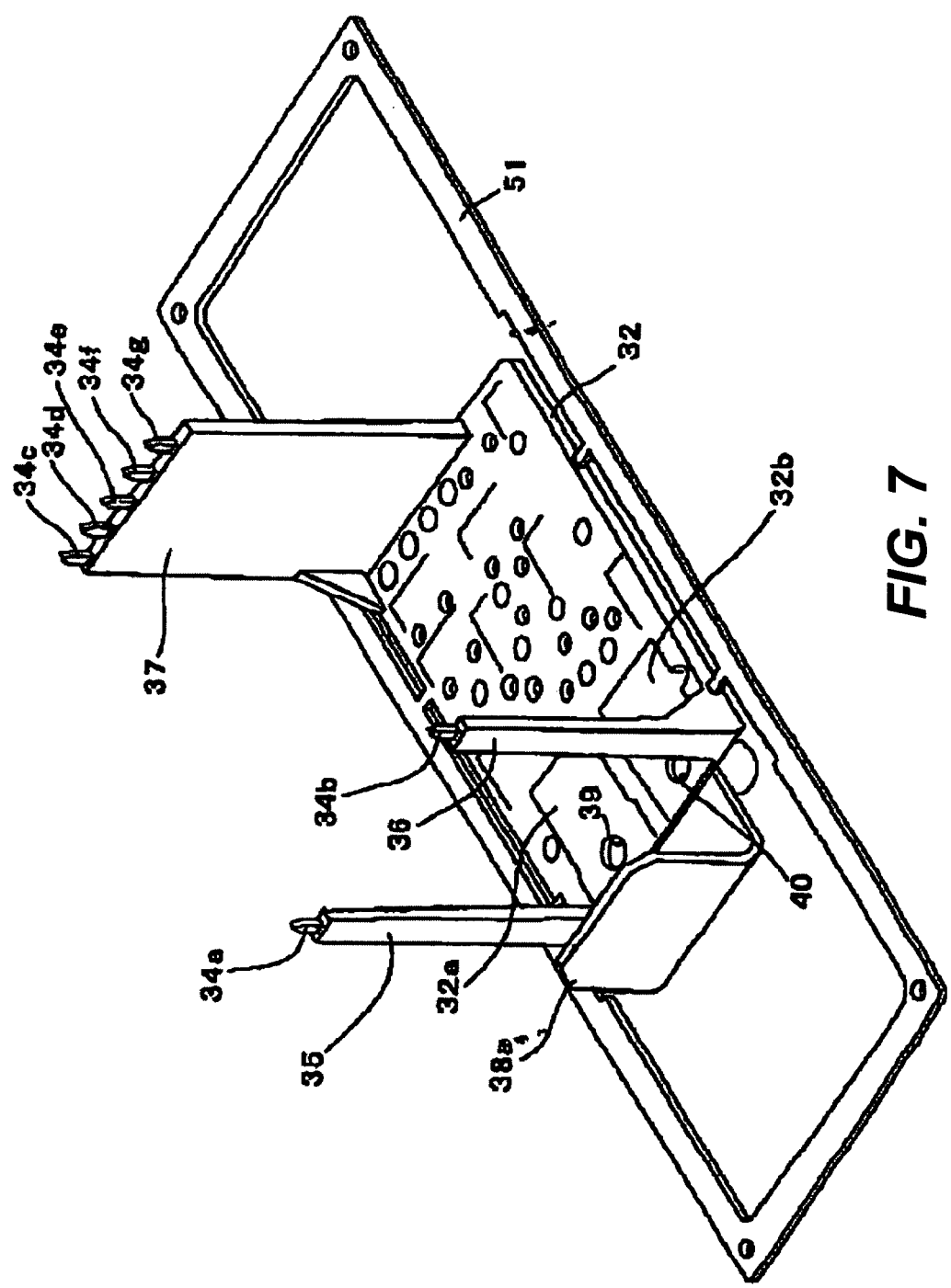
Figure 8:
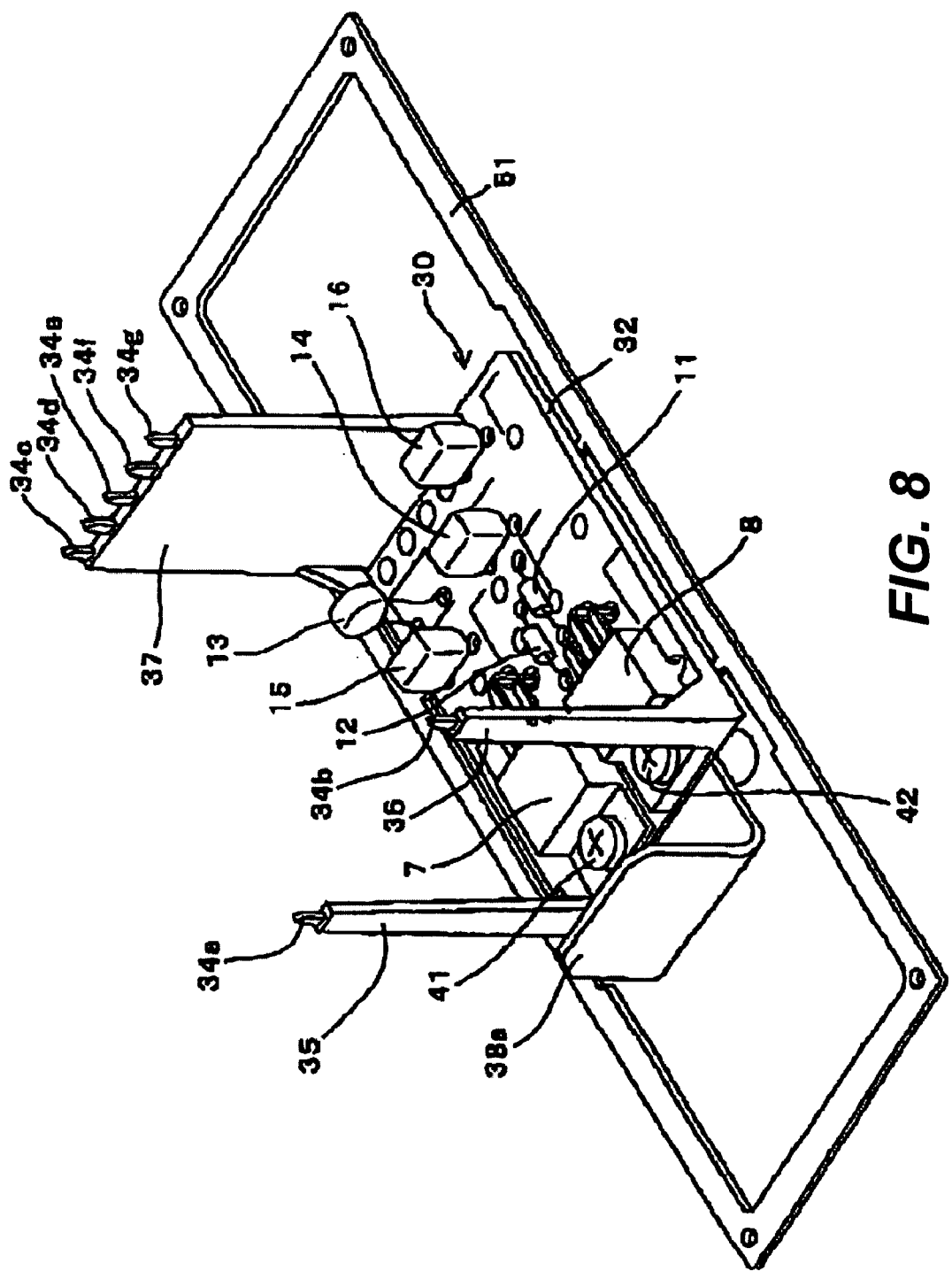
Figure 9A:
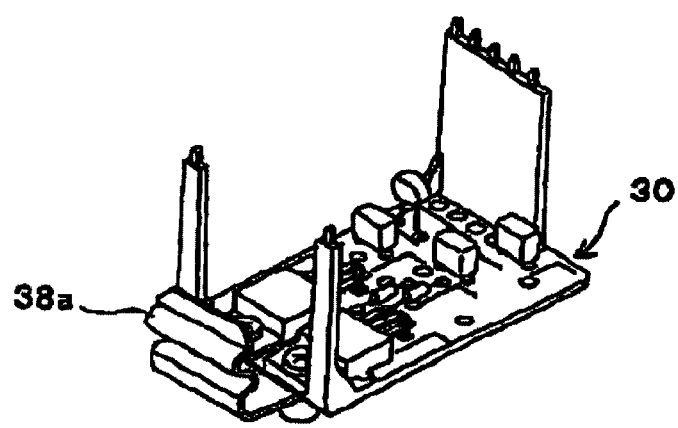
FIGS. 9A, 9B and 9C are diagonal views of other mounting substrates embodying this invention.
Figure 9B:
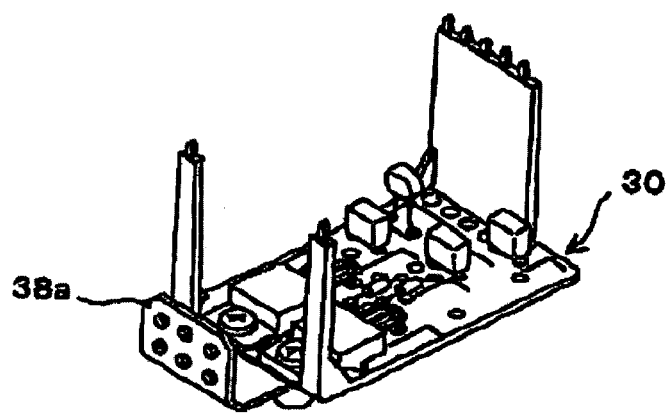
Figure 9C:
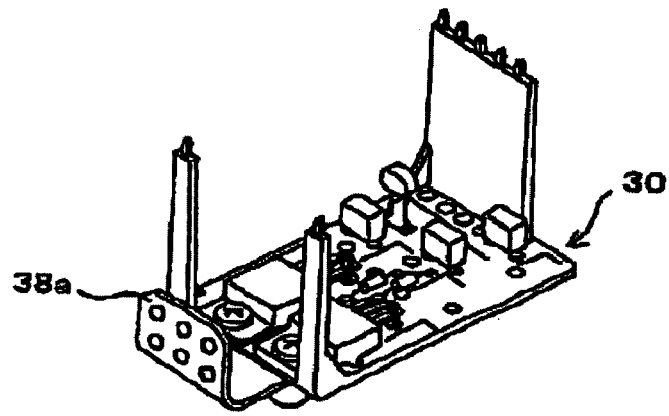

The invention will be described next by way of an embodiment with reference to the figures. FIG. 1 is an exploded diagonal view of a driving device embodying this invention, which is a driving unit for a power window of a vehicle next to a passenger seat, showing the side of its front surface. FIG. 2 is its exploded diagonal view, showing the side of its back surface. FIG. 3A is a diagonal view of the mounting substrate (with components mounted) and FIG. 3B is a diagonal view of the base substrate (with components mounted). FIG. 4 is a circuit diagram for showing main circuits of the driving device. FIGS. 5-8 are drawings for explaining the production process of the mounting substrate. FIGS. 9A, 9B and 9C are diagonal views of other mounting substrates embodying this invention.

With reference to FIG. 4 and other figures, the main circuit for the driving device includes relays 2 and 3 which serve to supply power to a motor 1, say, for opening and closing a window of a vehicle associated with one of the passenger seats by rotating it in the positive or negative direction, a switch 4 of the sliding type for manually or automatically indicating whether the motor 1 is to be rotated in the positive or negative direction, transistors 5 and 6 for respectively driving the relays 2 and 3 by the control of a control process circuit (not shown) such as a one-chip microcomputer, and a FET 7 and a flywheel diode 8 for the PWM control.

In the above, the transistors 5 and 6 and the control process circuit together are hereinafter also referred to as the control circuit, and this control circuit, the relays 2 and 3 and the switch 4 are together hereinafter also referred to as the basic circuit. The FET 7 and the flywheel diode 8 are together hereinafter also referred to as the circuit components for the PWM control. The control circuit including the transistors 5 and 6 and the aforementioned control process circuit is formed as an HIC (hybrid IC) in the example shown in FIG. 2 and indicated by numeral 10.

The resistors and capacitors indicated by numerals 11-15 in FIG. 4 are for the purpose of controlling and monitoring the FET 7 by means of the control process circuit and also correspond to the circuit components for the PWM control. The capacitor indicated by numeral 16, connected in parallel with the flywheel diode 8, is also required for the PWM control and is a part of the circuit components for the PWM control. Numeral 17 indicates an electrolytic capacitor and numeral 18 indicates a coil 18, both being a circuit component for removing noise.

Each of the relays 2 and 3 is comprised of an excitation coil (not symbolically indicated) and a so-called 1C contact point (that is, a common (C) terminal, a normally open (NO) terminal and a normally closed (NC) terminal) such that its common and normally closed terminals are connected when it is in the non-active condition and current is not being passed through the coil while its common and normally open terminals come to be connected when it is in the active condition and current is passed through the coil. The normally open terminals of the relays 2 and 3 are both connected through the coil 18 to the high-voltage line E1 of the power source, while their normally closed terminals are connected through the FET 7 to the grounding line G1 (or the lower voltage line) of the power source. The common terminal of the relay 2 is connected to terminal 1a of the motor coil for the motor 1 for causing the motor 1 to rotate in the positive direction when connected to the power source. The common terminal of the relay 3 is connected to terminal 1b of the motor coil for the motor 1 for causing the motor 1 to rotate in the reverse direction when connected to the power source.

The switch 4 is provided with four contact points (from the first through the fourth). One of the terminals of each contact point is connected not only to the power source line E1 through a resistor but also to one of the input lines of the aforementioned control process circuit. The other of the terminals of each contact point is connected to the grounding line G1. The switch 4 is structured such that, as its slider (not shown) is moved in one direction, the first contact point becomes closed first and the second contact point becomes closed next and that, as the slider is moved in the opposite direction, the third contact point becomes closed first and the fourth contact point becomes closed next.

Whenever any of the contact points of the switch 4 becomes closed, the voltage level of the corresponding input line changes from a high H level (above a threshold level) to a low L level (below the threshold level) and the control process circuit is adapted to conclude that a corresponding operation signal has been inputted. According to the present example being illustrated, it is concluded that an operation signal for closing the corresponding window manually (hereinafter referred to as the manual-up signal) has been inputted if the first contact point is closed. If the second contact point is closed, it is concluded that an operation signal for closing the window automatically (hereinafter referred to as the auto-up signal) has been inputted. If the third contact point is closed, it is concluded that an operation signal for opening the window manually (hereinafter referred to as the manual-down signal) has been inputted. If the fourth contact point is closed, it is concluded that an operation signal for opening the window automatically (hereinafter referred to as the auto-down signal) has been inputted.

The transistors 5 and 6 are each on the grounding side on the current-passing line of the coil of the corresponding relay 2 or 3 and are controlled by the aforementioned control process circuit. If the aforementioned manual-up signal is inputted to the control process circuit, for example, the control process circuit controls to activate only the transistor 6 throughout the period during which this signal is being inputted. As a result, a current is passed only to the excitation coil of the relay 3 by the voltage of the power source line E1 such that only the contact point of the relay 3 is activated and only the terminal 1b of the motor 1 is connected to the power source line E1. Thus, the motor 1 rotates in the reverse direction only during this period and the window is manually closed. If the auto-up signal is inputted to the control process circuit even temporarily, the control process circuit serves to carry out the control of activating only the transistor 6 until the window becomes completely closed such that the window is automatically operated until it becomes completely closed.

If the manual-down signal is inputted to the control process circuit, on the other hand, the control process circuit controls so as to activate only the transistor 5 throughout the period during which this signal is being inputted. As a result, a current is passed only to the excitation coil of the relay 2 by the voltage of the power source line E1 such that only the contact point of the relay 2 is activated and only the terminal 1a of the motor 1 is connected to the power source line E1. Thus, the motor 1 rotates in the positive direction only during this period and the window is manually opened. If the auto-down is inputted to the control process circuit even temporarily, the control process circuit serves to carry out the control of activating only the transistor 5 until the window becomes completely open such that the window is automatically operated until it becomes completely open.

The judgment whether or not the window has become completely closed or opened is made by the control process circuit based on detection output from a sensor (not shown) for detecting the rotary angle of the motor 1, angular position of the motor 1, quantity of motion by the window or the position of the window.

When the transistors 5 and 6, and hence the relays 2 and 3, are operated, the control process circuit controls the rotary speed of the motor 1 and hence the speed of the window by adjusting the current to the motor 1 by driving the FET at a specified duty ratio in the pulse width modulation.

If the function for preventing insertion is provided, it is the control process circuit that determines the occurrence of an insertion based, for example, on a detection output from a sensor. The operation program for the control process circuit may be set, for example, such that it will necessarily cause the window to move in the opening direction by a specified distance independently of the operation signal from the switch if it is determined during the auto-up operation that something has been inserted. If a communication function is provided, a means for receiving operation signals (such as wireless signals) may be provided such that a received signal can be inputted to the control process circuit and function like the operation signals from the switch. If the auto-up and auto-down functions are dispensed with, the switch 4 requires only two contact points and the control process circuit will carry out only controls on manual operations.

The mechanical structure of the driving device of this invention, and more particularly that of the driving unit for the driver's seat, will be described next.

FIGS. 1 and 2 show an example of the driving unit of this invention, having a generally rectangular base substrate 21 fastened between an upper case 22 and a lower case 23 and contained therein. An operating knob 24 is provided on the upper surface of the upper case 22, and a connector part 27 containing a connector 28 for connecting wires is provided on the lower surface of the lower case 23.

In addition to the aforementioned basic circuit components such as the transistors 5 and 6, the HIC 10 inclusive of the control process circuit, the relays 2 and 3 and the switch 4, the circuit components for eliminating noise such as the electrolytic capacitor 17 and the coil 18 and the connector 28 for making connections to the exterior, there is a mounting substrate 30 mounted to the base substrate 21. As shown in FIG. 8, the circuit components for the PWM control such as the FET 7, the flywheel diode 8, resistors 11-13 and capacitors 14-16 are mounted to this mounting substrate 30.

What was referred to above as the operating knob 24 may be an operating part placed on the elbow rest on the vehicle door and serves as a manual input device for the switch 4 such that the switch 4 can be activated and the condition of its contact points can be changed. The knob 24 may be adapted to be operated on by the operator's fingers from its neutral position (or its non-operating position) either in the direction of pulling it upward (or the direction for a command to close the window) or in the direction of pushing it downward (or the direction for a command to open the window).

The knob 24 is attached so as to be able to oscillate with respect to the upper case 22 around a shaft (not shown) extending in the direction of the width of the rectangular base substrate 21. There is an operating member (not shown) which is integrally formed with the knob 24 itself, extending downward inside the knob 24 and being inserted through an opening 21*a* formed in the base substrate 21 from the side of the mounting surface (on which the aforementioned components forming the basic circuit are mounted) so as to engage with the slider of the switch 4. Thus, as the knob 24 is operated, the slider of the switch 4 slides in a specified direction and a corresponding contact point of the switch 4 comes to be activated.

The knob 24 is formed with "joints" such that the operator moving it in any direction will have a feeling of going over joints or steps. In the case of a knob for a window with the function for automatic operations, for example, two joints are provided in each direction such that a manual (not automatic) operation is commanded if the knob is operated when the operator obtains the feeling for the first joint and an automatic operation is commanded if the knob is operated when the operator feels the second joint. In the case of a knob for a window without the function for automatic operations, the number of joints in each direction may be one because the operator will be commanding a manual operation when the first joint is felt.

Means for generating the feeling of a joint may comprise a spring and a cam mechanism, as disclosed in Japanese Patent Publication 2001-118465. Explained more in detail, such a mechanism may comprise a cylinder formed integrally with the operating knob and extending downward to an opening at the lower end, a sliding member which is inserted into the cylinder so as to be slidable axially, a coil spring inserted into this cylinder at a deeper (higher) position to provide a downward biasing force on the sliding member and a receiving member affixed to a fixed member such as the case 22 for supporting the knob and having an indentation on the upper surface for receiving the lower end of the sliding member. The indentation on the receiving member and the engaging surface at the tip of the sliding member are conically shaped as a whole such that the knob will be at a specified neutral non-operating position by the returning force of the coil spring when it is in the natural condition with no external force acting on it. The engaging surface is provided with step-like protrusions and indentations such that a feeling of joints with one step or two steps will be provided when the knob is moved in either direction in its oscillatory motion. The measurements and positions of all these components are adjusted such that feeling of joints in each direction of motion of the knob 24 and the operating conditions of the switch 4 will properly correspond.

The connector 28 is for connecting each of wiring patterns on the base substrate 21 with an external apparatus (such as the motor 1), a driver unit associated with another seat, the power source or the ground. The C-terminals of the relays 2 and 3 mounted to the base substrate 21 are connected to the coil terminals 1*a* and 1*b* of the motor 1 provided inside the door by the driver's seat through this connector 28 and wires connected thereto.

When the upper and lower cases 22 and 23 are assembled, the side walls of the lower case 23 are inserted inside the side walls of the upper case 22 while a plurality of protrusions 23*a* formed on the outer surface of the side walls of the lower case 23 engage elastically with the engaging openings 22*a* formed in the side walls of the upper case 22 such that their inserted condition can be maintained. The lower case 23 is provided with an opening 23*b* for exposing the connector 28 when the upper and lower cases 22 and 23 are in the assembled condition so as to form the aforementioned connector part 27 such that an insertion can be made to the connector 28 from outside.

The base substrate 21, having each circuit component and the mounting substrate 20 mounted thereto, is contained inside the upper and lower cases 22 and 23 as shown in FIG. 1 such that its outer surface not facing the mounting substrate 30 will be facing upward (towards the surface with the operating knob 24). In this condition, the upper edge of the lower case 23 contacts the lower surface of the peripheral edges of the base substrate 21, and the base substrate 21 is sandwiched between the upper edge of the lower case 22 and the ceiling surface inside the upper case 22.

The mounting substrate 30 is produced by processing a metallic plate material (say, of copper) and by molding it with an insulting material such as super engineering plastics. It has aforementioned heat-generating circuit components such as the FET 7 and the diode 8 mounted thereto and is itself mounted to the base substrate 21.

Figure 6:
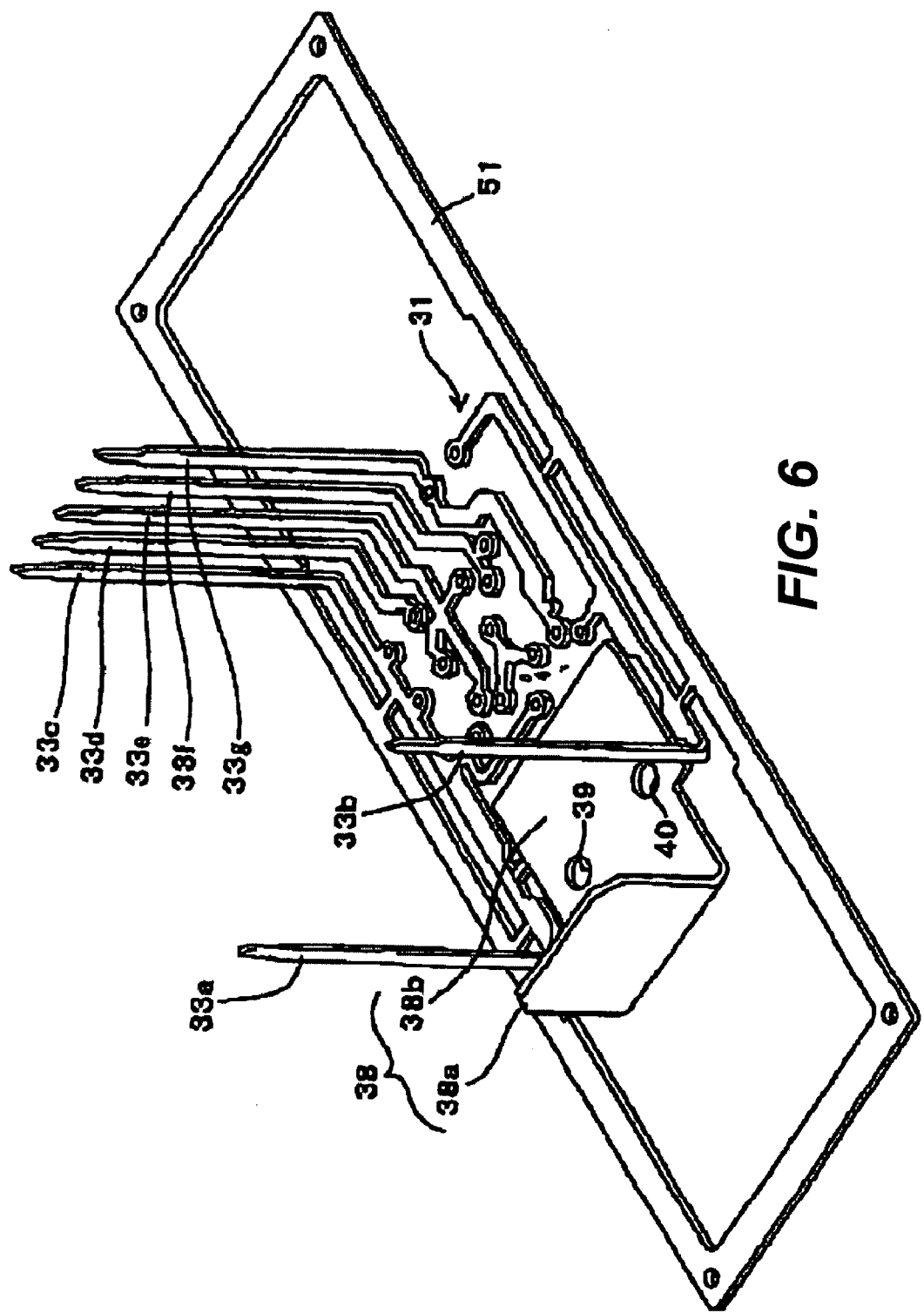

As shown in FIG. 8, the mounting substrate 30 comprises a rectangular base plate part 32 having the aforementioned circuit components mounted thereto and containing therein a circuit pattern 31 shown in FIG. 6 formed by processing the aforementioned metallic plate material. Connector conductors 33a-33g, containing therein the aforementioned metallic plate material which has been processed, are provided as shown in FIG. 6, extending approximately perpendicularly from both end parts of the base plate part 32. Legs 35-37 are formed with the externally exposed tips of these connector conductors 33a-33g protruding from a molded material to form connector terminals 34a-34g as shown in FIGS. 7 and 8. A heat dissipating plate 38 is formed near one end part of the base plate part 32 also by processing the aforementioned metallic plate material. The heat dissipating plate 38 includes a sectionally L-shaped heat-dissipating portion 38a which is extended from the base plate part 32 and is not covered by the insulating molded material.

The legs 35 and 36, respectively containing the connector conductors 33a and 33b, are formed on both sides of the heat dissipating plate 38 at one end portion of the rectangular base plate part 32 so as to be arranged together in the direction of the width of the base plate part 32. The leg 37 is wider and is formed on the opposite end part of the base plate part 32, containing the connector conductors 33c-33g. The heat dissipating plate 38 has a heat-receiving part 38b disposed inside the base plate part 32. As shown in FIG. 7, indentations 32a and 32b are formed respectively for accepting the FET 7 and the diode 8 on the mounting side of this heat-receiving part 38b. The FET 7 and the diode 8, which are both highly heat-generating components, are received in these indentations 32a and 32b either directly or through a thinned portion of the molded insulating material.

Screw holes 39 and 40 are formed in these indentations 32a and 32b in the heat-receiving part 38b as shown in FIG. 7. The FET 7 and the diode 8 are fastened to the base plate part 32 by means of screws 41 and 42 passed through these screw holes 39 and 40 as shown in FIG. 8.

The circuit components for PWM control, inclusive of the FET 7 and the diode 8, are mounted in a planar fashion on the inner surface opposite the base substrate 21 of the base plate part 32, as shown in FIGS. 2 and 8. A heat-dissipating opening 43 is formed on the mold part on the outer surface (on the side of the back surface) not facing the base substrate 21 of the base plate part 32 for exposing the heat-receiving part 38b. This heat-dissipating opening 43 is filled with a flow solder (not shown) for connecting circuit components.

Figure 5:
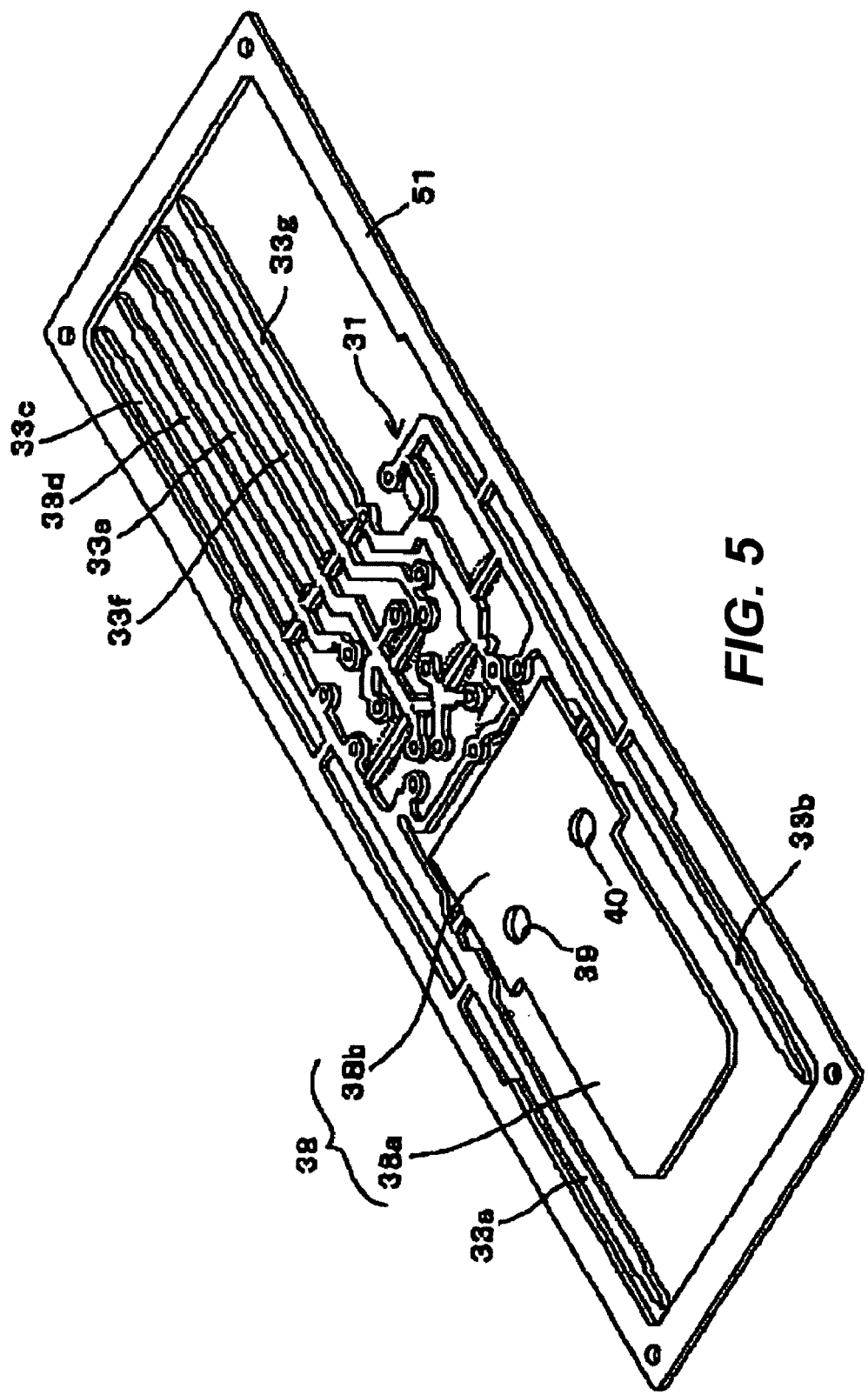
FIGS. 5-8 are drawings for showing the production process of the mounting substrate.

Next, a method for producing the mounting substrate 30 will be explained. First, a first intermediate product shown in FIG. 5 is obtained by subjecting a material for the aforementioned metallic plate to a press process such as cutting and punching. Numeral 51 in FIG. 5 indicates a frame for positioning or transportation. Next, the portion of the first intermediate product that will later become the connector conductors 33a-33g and the L-shaped heat dissipating portion 38a of the heat dissipating plate 38 are bent, and the portions shown surrounded by dotted lines in FIG. 5 are cut off and removed as unnecessary parts and the circuit pattern 31 is formed. A second intermediate product shown in FIG. 6 is thus obtained.

Next, portions that are to become the base plate part 32 and the legs 35-37 are formed by extrusion molding and a third intermediate product as shown in FIG. 7 is obtained. As an insulating plastic material for the base plate part 32, it is preferable to make use of super engineering plastics in view of the required resistance against heat and especially in view of required resistance against solders. With super engineering plastics, there is no problem with flow solder and the problem of deformation can be obviated even if the FET 7, etc. become heated. A less expensive kind of resin such as ABS resin may be used if resistance against heat is concerned but ABS resin is not strong against solders and there is the possibility of melting in the case of flow soldering.

Next, terminals of various circuit components are inserted into the throughholes prepared through the base plate part 32 of the third intermediate product shown in FIG. 7. The FET 7 and the diode 8 are screwed in as explained above. The terminals thus inserted are connected to the corresponding throughholes by flow soldering such that the required circuit components become mounted on the inner (mounting) surface of the base plate part 32 as shown in FIG. 8. The flow solder is applied from the opposite outer surface by a jet stream method. In the same process as the application into the throughholes, flow solder is also applied to the interior of the heat-dissipating opening 43. The frame 51 is finally cut off and removed.

A mounting substrate thus produced according to this invention may be characterized as having a metallic heat dissipating plate (shown at 38) having a heat dissipating portion (shown at 38a) not covered by the insulating molded material and hence capable of emitting heat significantly more efficiently, say, than the prior art substrate according to aforementioned Japanese Patent Publication Tokkai 10-201050.

According to the example described above, furthermore, the heat dissipating plate 38 is formed as a portion of the mounting substrate 30 in the same production process as the wiring pattern 31 of the base plate part 32 by using the same metallic material. Thus, the production cost can be reduced because they can be made easily, say, by continuously punching out forms from the same material. A different material may be used for the production of the mounting substrate but it is not preferable because the yield is adversely affected.

The example illustrated above is not intended to limit the scope of the invention. Many modifications and variations are possible within the scope of the invention. The heat dissipating portion 38a may be curved as shown in FIG. 9A, provided with a plurality of openings as shown in FIG. 9B or provided with a plurality of protrusions as shown in FIG. 9C so as to increase the surface area through which heat can be dissipated more efficiently. Moreover, the heat dissipating plate and the heat dissipating part may be provided at different positions on the base plate part.

It goes without saying that the present invention can also be applied to a driving device for a seat having a plurality of operating knobs.

What is claimed is:

1. A mounting substrate comprising:
   a base plate part that is planar and rectangular, having a circuit pattern made of a metallic plate material inside a molded insulating material;
   legs extending approximately perpendicularly from both end sides of said base plate part and having connector conductors made of said metallic plate material inside said molded insulating material, said connector conductors each having a tip part exposed from said molded insulating material to serve as a contact terminal; and a heat dissipating plate made of said metallic plate material at one end side of said base plate part, said heat dissipating plate having a heat dissipating part that is extending from said base plate part and is externally exposed.

2. The mounting substrate of claim 1 wherein at least one of said legs and said heat dissipating plate are next to each other on said end side of said base plate part.

3. The mounting substrate of claim 1 wherein said heat dissipating plate includes a heat-receiving part disposed inside said base plate part.

4. The mounting substrate of claim 3 wherein said base plate part has an outer surface, said molded insulating material having a heat dissipating opening formed on said outer surface of said base plate part such that said heat dissipating plate is exposed to the exterior.

5. The mounting substrate of claim 1 having highly heat-generating circuit components mounted thereto proximally to said heat dissipating part and being mounted to a base substrate, a basic circuit for controlling said highly heat-generating circuit components being mounted to said base substrate, wherein said highly heat-generating circuit components generate significantly more heat than other circuit components mounted to said base substrate under normal operating conditions.

6. The mounting substrate of claim 5 wherein at least one of said legs and said heat dissipating plate are next to each other on said end side of said base plate part.

7. The mounting substrate of claim 5 wherein said heat dissipating plate includes a heat-receiving part disposed inside said base plate part.

8. The mounting substrate of claim 7 wherein said base plate part has an outer surface, said molded insulating material having a heat dissipating opening formed on said outer surface of said base plate part such that said heat dissipating plate is exposed to the exterior.

9. A driving device for a motor, said driving device comprising:

relays for operating said motor by supplying power from a power source according to operation condition of an operating part;

a switch adapted to change switch condition thereof according to said operation condition of said operating part;

a control circuit for controlling said relays according to said switch condition of said switch;

a basic circuit that includes said relays, said switch and said control circuit;

a base substrate to which said basic circuit is mounted;

a mounting substrate mounted to said base substrate; and control circuit components mounted to said mounting substrate, said control circuit components including a switching element being connected to a power line of said motor and serving to control said motor when said motor is operating;

wherein mounting substrate comprises:

a base plate part that is planar and rectangular, having a circuit pattern made of a metallic plate material inside a molded insulating material;

legs extending approximately perpendicularly from both end sides of said base plate part and having connector conductors made of said metallic plate material inside said molded insulating material, said connector conductors each having a tip part exposed from said molded insulating material to serve as a contact terminal; and a heat dissipating plate made of said metallic plate material at one end side of said base plate part, said heat dissipating plate having a heat dissipating part that is extending from said base plate part and is externally exposed.

10. The driving device of claim 9 wherein at least one of said legs and said heat dissipating plate are next to each other on said end side of said base plate part.

11. The driving device of claim 9 wherein said heat dissipating plate includes a heat-receiving part disposed inside said base plate part.

12. The driving device of claim 11 wherein said base plate part has an outer surface, said molded insulating material having a heat dissipating opening formed on said outer surface of said base plate part such that said heat dissipating plate is exposed to the exterior.

13. The driving device of claim 9 wherein said basic circuit has components that are mounted to inner surface of said base substrate facing said mounting substrate;

wherein said operating part is disposed on an outer surface of said base substrate not facing said mounting substrate; and wherein an operating member movable with said operating part is connected to said switch through an opening formed through said base substrate such that said switch condition of said switch is varied.

14. The driving device of claim 9 wherein said motor is for moving a mobile component of a vehicle.

* * * * *